United States Patent
Barrow et al.

(10) Patent No.: US 10,067,350 B1
(45) Date of Patent: Sep. 4, 2018

(54) SYSTEM AND METHOD FOR PROVIDING MULTIMODE IMAGING, TRACKING, AND RANGING WITH A SINGLE LENS

(71) Applicant: LOCKHEED MARTIN CORPORATION, Bethesda, MD (US)

(72) Inventors: William H. Barrow, Clermont, FL (US); Thomas E. Haberfelde, Clermont, FL (US); James A. Fry, Orlando, FL (US)

(73) Assignee: LOCKHEED MARTIN CORPORATION, Bethesda, MD (US)

( * ) Notice: Subject to any disclaimer, the term of this patent is extended or adjusted under 35 U.S.C. 154(b) by 817 days.

(21) Appl. No.: 14/560,090

(22) Filed: Dec. 4, 2014

(51) Int. Cl.
G02B 27/14 (2006.01)
H01L 27/144 (2006.01)

(52) U.S. Cl.
CPC .......... *G02B 27/141* (2013.01); *H01L 27/144* (2013.01)

(58) Field of Classification Search
CPC .... G02B 27/14; G02B 27/144; G02B 27/142; G02B 27/283; G02B 27/0172
USPC ................................................. 359/629–634
See application file for complete search history.

(56) References Cited

U.S. PATENT DOCUMENTS

| | | | |
|---|---|---|---|
| 2,379,790 A | 7/1945 | Dimmick | |
| 5,296,961 A | 3/1994 | Trost et al. | |
| 5,341,238 A | 8/1994 | Trost et al. | |
| 5,432,330 A * | 7/1995 | Nakamura | G01B 11/026 250/201.4 |
| 6,250,583 B1 | 6/2001 | Livingston | |
| 6,614,596 B2 * | 9/2003 | Gladnick | G01N 21/8806 359/630 |
| 6,628,385 B1 * | 9/2003 | Osipchuk | G02B 21/002 250/458.1 |
| 6,671,100 B1 * | 12/2003 | McRuer | G02B 27/0081 359/630 |
| 9,060,712 B2 * | 6/2015 | Buckland | A61B 3/13 |
| 2003/0190113 A1 * | 10/2003 | Huang | G02B 6/3586 385/18 |
| 2005/0046936 A1 * | 3/2005 | Dixon | G02B 26/101 359/385 |
| 2008/0049584 A1 * | 2/2008 | Tan | G02B 5/305 369/112.16 |
| 2016/0169814 A1 * | 6/2016 | Hashimoto | G01N 21/8806 250/358.1 |

* cited by examiner

*Primary Examiner* — Mohammed Hasan
(74) *Attorney, Agent, or Firm* — Terry M. Sanks, Esq.; Beusse Wolter Sanks & Maire, PLLC (57) ABSTRACT

An imaging system including a dichroic beamsplitter configured to be angled at least at a first angle and a second angle wherein when angled at the first angle imaging at a broad band wavelength spectrum and at least one of laser designation and laser ranging performed with a laser beam occurs with the dichroic beamsplitter and when angled at the second angle the imaging at the broad band wavelength spectrum and laser spot tracking performed with a laser beam occurs through the dichroic beamsplitter. Another system and method are also disclosed.

20 Claims, 6 Drawing Sheets

SYSTEM AND METHOD FOR PROVIDING MULTIMODE IMAGING, TRACKING, AND RANGING WITH A SINGLE LENS

BACKGROUND

Embodiments relate to an imaging system and, more particularly, to a system and method for providing multimode functionality through a single aperture of the imaging system.

Recently, shortwave infrared (SWIR) imaging systems or cameras have been developed with a capability of providing both SWIR imaging and laser spot tracking (LST) simultaneously. For certain imaging systems, a need for laser designation and/or ranging (LDR) in conjunction with SWIR imaging and LST is desired. Currently, there is a path for the LDR and a separate quad-detector and optical path and switch mirror is used for the LST, however, such designs preclude providing for simultaneous operation.

Thus, manufacturers and users of such SWIR imaging systems that also provide for LST would benefit from a system and method which also provides for SWIR imaging and LDR simultaneously and with use of a common combining optical element that is used for SWIR imaging and LST.

SUMMARY

Embodiments relate to a system and a method for providing multimode functionality with a single dichroic beamsplitter of the imaging system. The system is an imaging system comprising a dichroic beamsplitter configured to be angled at least at a first angle and a second angle wherein when angled at the first angle imaging at a broad band wavelength spectrum and at least one of laser designation and laser ranging performed with a laser beam occurs with the dichroic beamsplitter and when angled at the second angle the imaging at the broad band wavelength spectrum and laser spot tracking performed with a laser beam occurs through the dichroic beamsplitter.

Another system is also an imaging system comprising a dichroic beamsplitter having a dichroic optical coating configured to provide for a broad band spectrum of light to pass through the dichroic beamsplitter independent of an angle of incidence of the dichroic beamsplitter and to at least one of transmit and reflect a laser beam wherein transmission or reflection of the laser beam is determinative from the angle of incidence of the dichroic beamsplitter.

The method comprises transmitting an image in a broad band spectrum through a dichroic beamsplitter, having a dichroic optical coating, located within an imaging system when the dichroic beamsplitter is at a first angle of incidence and transmitting an image in the broad band spectrum through the dichroic beamsplitter, having the dichroic optical coating, located within the imaging system when the dichroic beamsplitter is at second angle of incidence. The method further comprises reflecting a laser from the dichroic beamsplitter when the dichroic beamsplitter is at the first angle of incidence, and transmitting the laser through the dichroic beamsplitter when the dichroic beamsplitter is at the second angle of incidence.

BRIEF DESCRIPTION OF THE DRAWINGS

A more particular description briefly stated above will be rendered by reference to specific embodiments thereof that are illustrated in the appended drawings. Understanding that these drawings depict only typical embodiments and are not therefore to be considered to be limiting of its scope, the embodiments will be described and explained with additional specificity and detail through the use of the accompanying drawings in which.

DETAILED DESCRIPTION

Embodiments are described herein with reference to the attached figures wherein like reference numerals are used throughout the figures to designate similar or equivalent elements. The figures are not drawn to scale and they are provided merely to illustrate aspects disclosed herein. Several disclosed aspects are described below with reference to non-limiting example applications for illustration. It should be understood that numerous specific details, relationships, and methods are set forth to provide a full understanding of the embodiments disclosed herein. One having ordinary skill in the relevant art, however, will readily recognize that the disclosed embodiments can be practiced without one or more of the specific details or with other methods. In other instances, well-known structures or operations are not shown in detail to avoid obscuring aspects disclosed herein. The embodiments are not limited by the illustrated ordering of acts or events, as some acts may occur in different orders and/or concurrently with other acts or events. Furthermore, not all illustrated acts or events are required to implement a methodology in accordance with the embodiments.

Notwithstanding that the numerical ranges and parameters setting forth the broad scope are approximations, the numerical values set forth in specific non-limiting examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 4.

Figure 1:
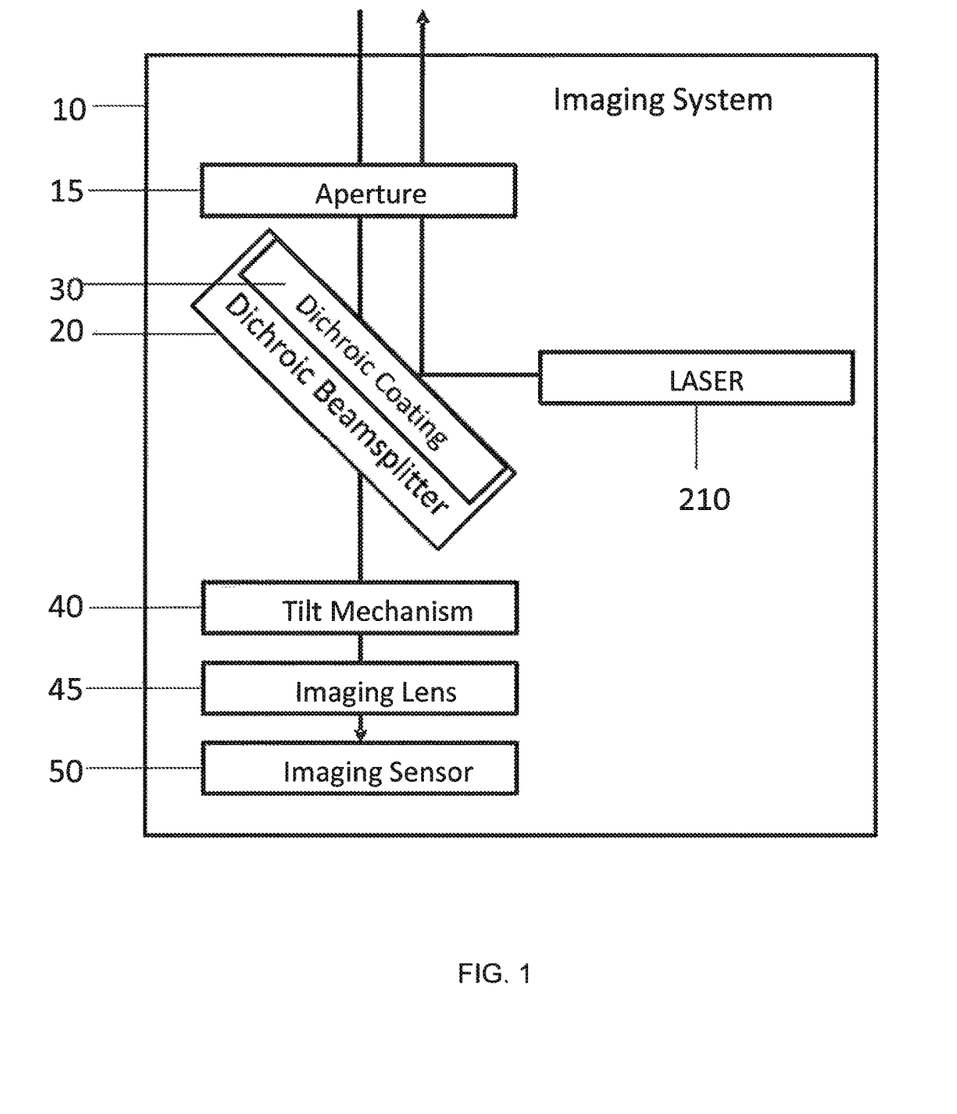
FIG. 1 shows a block diagram of an embodiment of an imaging system.

FIG. 1 shows a block diagram of an embodiment of an imaging system. In general, and as illustrated, the imaging system 10 may have a single aperture 15 through which imaging and tracking takes place. The imaging system may further comprise a dichroic beamsplitter 20 used for imaging and tracking when in a transmissive state for a laser and for ranging and/or designating when in a reflective state for a laser. The dichroic beamsplitter 20 may have a dichroic coating 30. The dichroic coating may be configured so that a shift to shorter wavelengths occurs as an angle of incidence of the dichroic beamsplitter increases. As a non-limiting example, the dichroic coating may provide for the dichroic beamsplitter acting as a narrowband reflector designed to produce maximum reflectance at a first angle of incidence at a first wavelength and then may instead produce a maximum reflectance at a shorter wavelength when used at an increased or second angle of incidence. However, for a sufficiently wide broadband transmission band surrounding the first wavelength, such as, but not limited to, at least one of near infrared (NIR), short wave infrared (SWIR), long wave infrared (LWIR), and visible light transmission through the dichroic beamsplitter and dichroic coating occurs when at either the first angle of incidence, the second angle of incidence and any angle of incidence there between.

A mechanism 40, such as, but not limited to, a tilt mechanism is provided to tilt, angle or place the dichroic beamsplitter at a desired angle of incidence. Though not illustrated, the mechanism 40 may be controlled electronically to place the dichroic beamsplitter 20 in position for operating in a first mode or a second mode, as discussed in further detail below. An imaging sensor 50, such as, but not limited to, a focal plane array may be provided to capture an image.

Figure 2A:
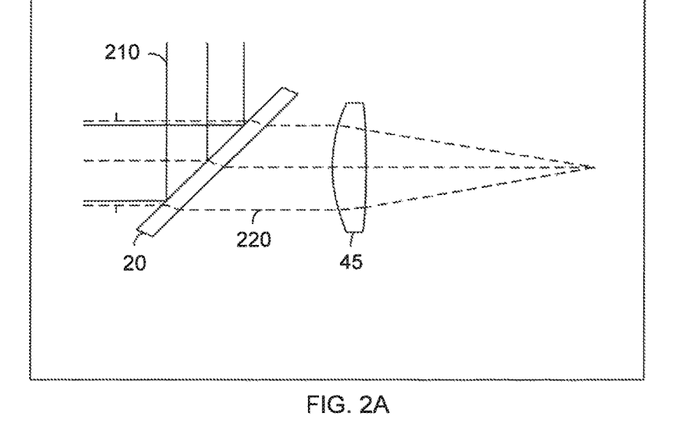
FIG. 2A shows a block diagram of a tilted dichroic beamsplitter within the imaging system during a first mode.

FIG. 2A shows a block diagram of a tilted dichroic beamsplitter within the imaging system during a first mode. As illustrated, the dichroic beamsplitter 20 with the dichroic coating is at the first angle of incidence, such as, but not limited to, approximately 45 degrees. As used herein several angles are defined by approximate degrees. The approximate degrees may vary by +/−3 degrees. At the first angle of incidence, a laser 210 may be reflected by the dichroic coating 30 of the dichroic beamsplitter 20. More specifically, the laser 210 may have its electric field along the plane of incidence, or p-polarization, and its electric field normal to the plane of incidence, or s-polarization, both reflected at the first angle of incidence. The angle of incidence is based on a tilting or angling of the dichroic beamsplitter 20. By being reflected, the laser 210 may be used for designating and ranging the system 10 to a target being imaged. However the s-polarization and p-polarization of both NIR and SWIR may transmit through the dichroic beamsplitter 20 and dichroic coating 30 at the first angle of incidence.

Figure 2B:
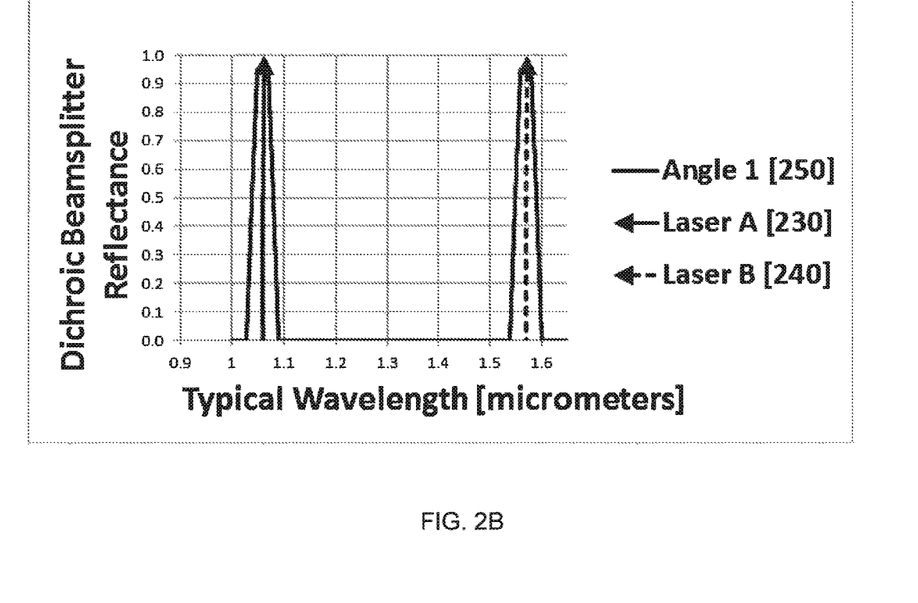
FIG. 2B shows a graphical representation of reflectance versus wavelength during the first mode.

FIG. 2B shows a graphical representation of reflectance versus wavelength during the first mode. The first vertical line 230 is representative of a first laser wavelength, at approximately 1064 nm and the second vertical line 240 is representative of a second laser wavelength, at approximately 1573 nm. The other line 250 is representative of the dichroic coating 30 in reflectance. As illustrated the reflective bands of the dichroic coating are in line with the laser wavelengths. Therefore, in between approximately 1.0 um and 1.5 um, which is equivalent to the SWIR bandwidth, transmission through the dichroic coating 30 is possible.

Figure 3A:
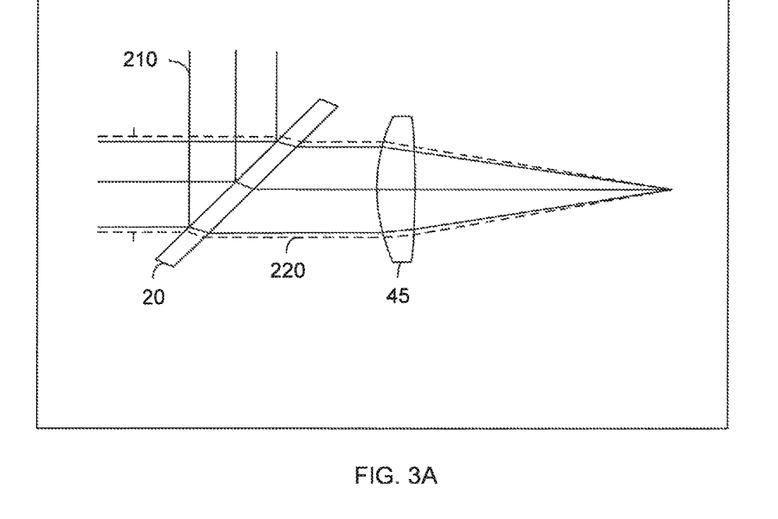
FIG. 3A shows a block diagram of a tilted dichroic beamsplitter within the imaging system during a second mode.

FIG. 3A shows a block diagram of a tilted dichroic beamsplitter within the imaging system during a second mode. When in the second mode, the angle of incidence is changed, such as, but not limited to, increased to a second angle of incidence. As a non-limiting example, a second angle of incidence is approximately 55 degrees. As with the first angle of incidence, the s-polarization and p-polarization of both NIR and SWIR may transmit through the dichroic beamsplitter 20 and dichroic coating 30 at the second angle of incidence. The second angle of incidence may be established by an increased tilting or angling of the dichroic beamsplitter 20. At the second angle of incidence, the laser may be able to transmit through the dichroic beamsplitter 20 and dichroic coating 30 in both s-polarization and p-polarization. Thus, the imaging sensor may be used for laser spot tracking in addition to imaging the target.

Figure 3B:
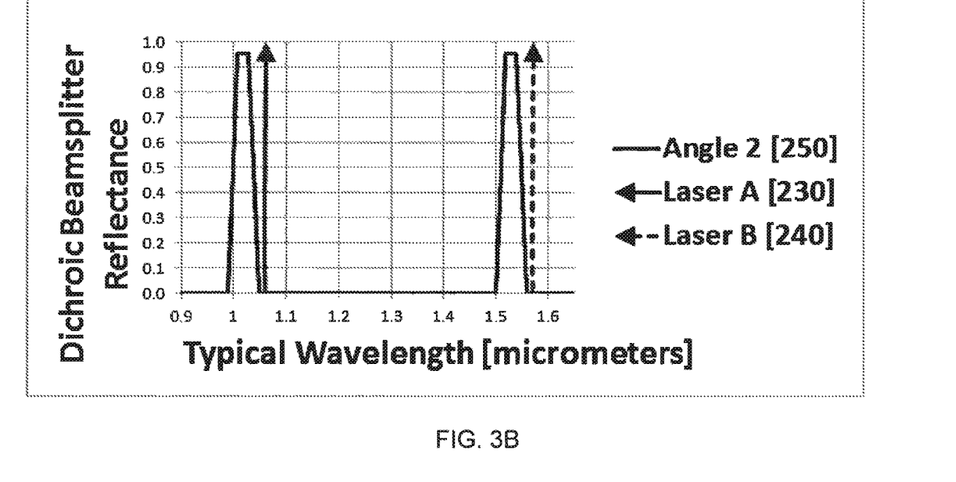
FIG. 3B shows a graphical representation of reflectance versus wavelength during the second mode.

FIG. 3B shows a graphical representation of reflectance versus wavelength during the second mode. With a change in the angle of incidence, the vertical lines 230, 240 representative of the laser wavelengths are no longer within the reflective range of the dichroic coating 30. Instead, the laser wavelengths are in the transmission range of the dichroic coating 30. The SWIR bandwidth remains within the transmission range of the dichroic coating 30.

Figure 4:
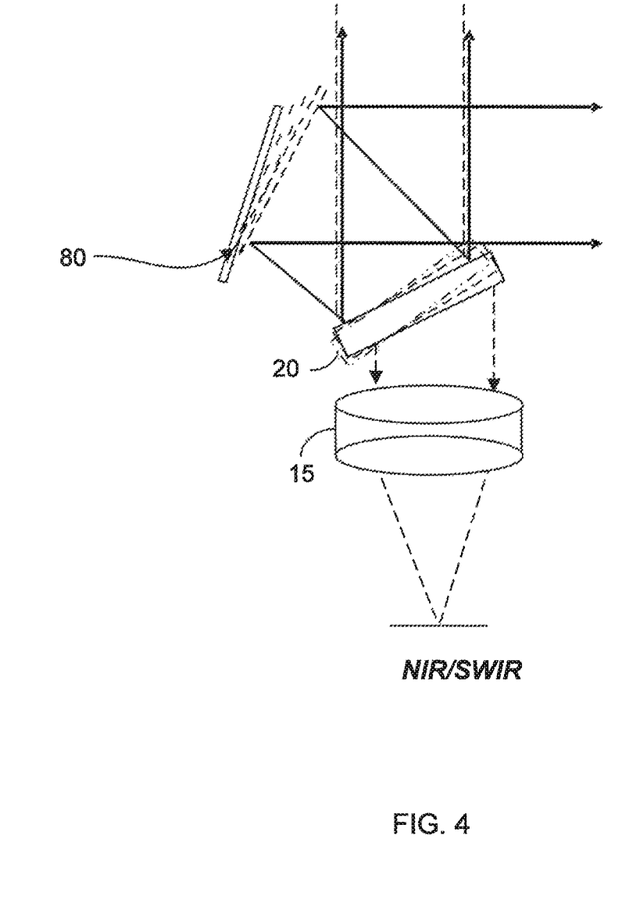
FIG. 4 shows a block diagram of a tilted penta prism with a dichroic coating on one surface within the imaging system during a first mode.

FIG. 4 shows a block diagram of another embodiment of a tilted dichroic beamsplitter and a reflector within the imaging system during a first mode. As illustrated a second invariant reflector is provided. As a non-limiting example the second reflector may be a penta prism 80. Thus, the second reflector may be provided to deviate a beam of light by a constant 90°, even if the entry beam is not at 90° to the prism. As illustrated, the beam of light being deviated is the laser reflected from the dichroic beamsplitter 20 and the dichroic coating 30. Thus, the laser is reflected or deflected from the prism to provide for a constant 90 degree beam so that the laser will be directed at a sensor, not shown, to assist in ranging and designating a target being imaged. The graphs illustrated in FIG. 2A and FIG. 2B are applicable to the configuration embodied in FIG. 4.

Figure 5A:
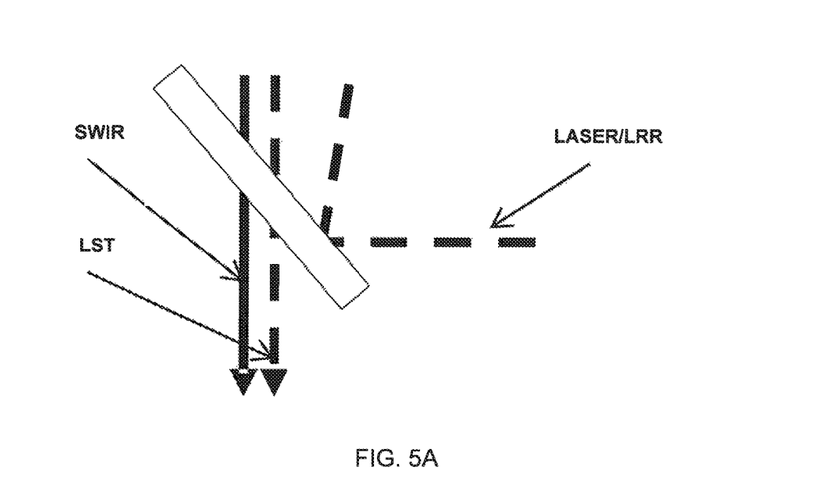
FIG. 5A shows a block diagram of a tilted dichroic beamsplitter.

FIG. 5A shows a block diagram of a tilted dichroic beamsplitter within the imaging system when transitioning between the first mode and the second mode. As disclosed above, a mechanism is provided to change the angle of incidence of the dichroic beamsplitter 20 from the first mode to the second mode. During this transition phase the dichroic beamsplitter may continue to be used for imaging. Thus, as illustrated, while transitioning between the two modes disclosed above, such as, but not limited to, at an angle of incidence of 50 degrees, the s-polarization and p-polarization of both NIR and SWIR may transmit through the dichroic beamsplitter 20 and dichroic coating 30 while transitioning between modes. The laser may partially transmit and reflect through the dichroic beamsplitter 20 and dichroic coating 30 while in transition between the two modes.

Figure 5B:
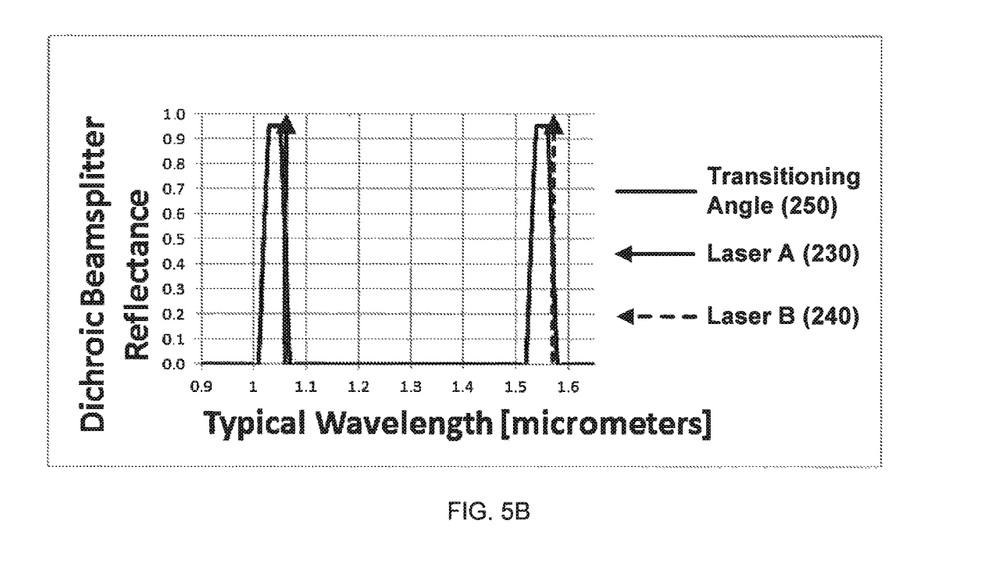
FIG. 5B shows a graphical representation of reflectance versus wavelength at an angle of incidence between a first mode and a second mode.

FIG. 5B shows a graphical representation of reflectance versus wavelength at an angle of incidence between the first mode and the second mode. As the angle of incidence transitions between modes, the vertical lines 230, 240, representative of the laser wavelengths, are moving outside of the reflective range of the dichroic coating 30. The SWIR bandwidth remains within the transmission range of the dichroic coating 30.

Though two modes are disclosed above, the use of two modes is not disclosed as a limiting factor. Additional modes may be provided as well. As a non-limiting example, if lasers with different wavelengths are used, at least one additional mode may be provided for each additional different type of laser that may be used with the imaging system 10.

As disclosed above, an imaging system 10 may be provided that comprises an optical dichroic beamsplitter 20 configured to be angled at least at a first angle and a second angle wherein when angled at the first angle imaging at a broad band wavelength spectrum 220 and at least one of laser designation and laser ranging performed with a laser beam 210 occurs with the dichroic beamsplitter 20 and when angled at the second angle the imaging at the broad band wavelength spectrum 220 and laser spot tracking performed with a laser beam 210 occurs through the dichroic beamsplitter 20. The optical dichroic beamsplitter 20 may comprise a dichroic optical coating 30 configured to shift to a reduced wavelength (of light) capable of passing through the dichroic beamsplitter 20 as an angle of incidence of the dichroic beamsplitter 20 increases.

In another embodiment, the imaging system may comprise a dichroic beamsplitter 20 having a dichroic optical coating 30 configured to provide for a broad band spectrum of light 220 to pass through the dichroic beamsplitter 20 independent of, or regardless of, an angle of incidence of the dichroic beamsplitter 20 and to at least one of transmit and reflect a laser beam 210 wherein transmission or reflection of the laser beam 210 is determinative from the angle of incidence of the dichroic beamsplitter 20.

In both embodiments, the broad band spectrum may comprise any broad waveband, including, but not limited to, at least one of near infrared spectrum, short wave infrared spectrum, long wave infrared spectrum, and visible light spectrum. The first angle and the second angle may be sufficiently separated, such as, but not limited to, approximately 10 degrees apart. The first angle or angle of incidence may be approximately 45 degrees and the second angle or angle of incidence may be approximately 55 degrees. In another non-limiting example, the second angle may be approximately 35 degrees if a shift to longer wavelengths is desired. The dichroic optical coating may provide for at least one of transmitting and reflecting a beam of light with a wavelength of approximately 1064 nm depending upon the angle of incidence of the dichroic beamsplitter.

The system in either embodiment may further comprise a mechanism configured to angle the dichroic beamsplitter 20 to at least one of the first angle and the second angle. An imaging sensor may also be provided to capture an image.

Though the angle of incidence of the dichroic beamsplitter 20 is changed, as illustrated when comparing FIGS. 2A and 3A, the NIR or SWIR beam is only displaced whereas the line of sight is not shifted. Therefore, as further illustrated in FIG. 5A, the SWIR beam may operate through an entire transition range of the dichroic beamsplitter between various modes.

Figure 6:
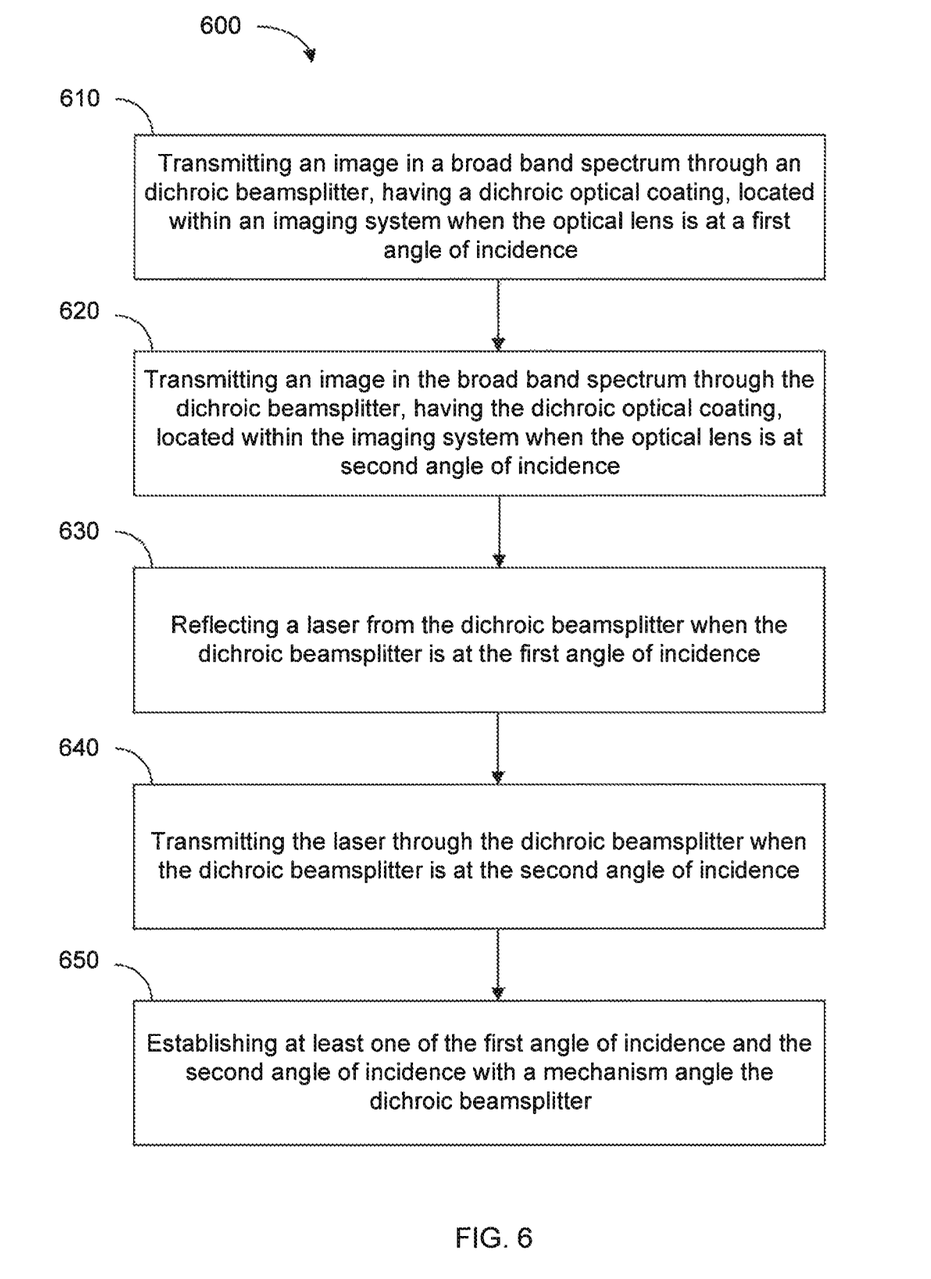
FIG. 6 shows a flowchart illustrating an embodiment of a method.

FIG. 6 shows a flowchart illustrating an embodiment of a method. The method 600 comprises transmitting an image in a broad band spectrum through a dichroic beamsplitter, having a dichroic optical coating, located within an imaging system when the dichroic beamsplitter is at a first angle of incidence, at 610. The method 600 also comprises transmitting an image in the broad band spectrum through the dichroic beamsplitter, having the dichroic optical coating, located within the imaging system when the dichroic beamsplitter is at second angle of incidence, at 620. The method 600 further comprises reflecting a laser from the dichroic beamsplitter when the dichroic beamsplitter is at the first angle of incidence, at 630. The method also comprises transmitting the laser through the dichroic beamsplitter when the dichroic beamsplitter is at the second angle of incidence, at 640.

The method 600 may further comprise establishing at least one of the first angle of incidence and the second angle of incidence with a mechanism configured to angle or tilt the dichroic beamsplitter, at 650. Reflecting the laser from the dichroic beamsplitter when the dichroic beamsplitter is at the first angle of incidence, at 630, may provide for laser designation and ranging. Transmitting the laser through the optical lens when the optical lens is at the second angle of incidence, at 640, may provide for laser spot tracking. Though the method steps are shown as appearing in a particular sequence, the steps are not limited to the sequence illustrated as any other sequence may be utilized.

The terminology used herein is for the purpose of describing particular embodiments only and is not intended to be limiting. As used herein, the singular forms "a," "an," and "the" are intended to include the plural forms as well, unless the context clearly indicates otherwise. Furthermore, to the extent that the terms "including," "includes," "having," "has," "with," or variants thereof are used in either the detailed description and/or the claims, such terms are intended to be inclusive in a manner similar to the term "comprising." Moreover, unless specifically stated, any use of the terms first, second, etc., does not denote any order or importance, but rather the terms first, second, etc., are used to distinguish one element from another.

Unless otherwise defined, all terms (including technical and scientific terms) used herein have the same meaning as commonly understood by one of ordinary skill in the art to which embodiments of the invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

While various disclosed embodiments have been described above, it should be understood that they have been presented by way of example only, and not limitation. Numerous changes, omissions and/or additions to the subject matter disclosed herein can be made in accordance with the embodiments disclosed herein without departing from the spirit or scope of the embodiments. Also, equivalents may be substituted for elements thereof without departing from the spirit and scope of the embodiments. In addition, while a particular feature may have been disclosed with respect to only one of several implementations, such feature may be combined with one or more other features of the other implementations as may be desired and advantageous for any given or particular application. Furthermore, many modifications may be made to adapt a particular situation or material to the teachings of the embodiments without departing from the scope thereof.

Therefore, the breadth and scope of the subject matter provided herein should not be limited by any of the above explicitly described embodiments. Rather, the scope of the embodiments should be defined in accordance with the following claims and their equivalents.

We claim:

1. An imaging system comprising a dichroic beamsplitter configured to be tilted by a tilt mechanism at least at a first angle during a first mode and a second angle during a second mode so that when tilted by the tilt mechanism at the first angle, a first image is captured at a broad band wavelength spectrum and at least one of laser designation and laser ranging performed with a laser beam which occurs with the dichroic beamsplitter and when tilted by the tilt mechanism at the second angle a second image is captured at the broad band wavelength spectrum and laser spot tracking performed with the laser beam which occurs through the dichroic beamsplitter.

2. The system according to claim 1, wherein the dichroic beamsplitter comprises a dichroic optical coating configured to shift to a reduced wavelength of light capable of passing through the dichroic beamsplitter as an angle of incidence of the dichroic beamsplitter increases.

3. The system according to claim 2, wherein the dichroic optical coating provides for at least one of transmitting and reflecting a beam of light with a wavelength of approximately 1064 nm depending upon the angle of incidence of the dichroic beamsplitter.

4. The system according to claim 1, wherein the broad band spectrum comprises at least one of near infrared spectrum, short wave infrared spectrum, long wave infrared spectrum, and visible light spectrum.

5. The system according to claim 1, wherein the first angle and the second angle are sufficiently separated.

6. The system according to claim 1, wherein the first angle is approximately 45 degrees and the second angle is one of approximately 35 degrees and approximately 55 degrees.

7. The system according to claim 1, wherein when tilted at the first angle the dichroic beamsplitter being configured to reflect the laser beam provided for the at least one of laser designation and ranging.

8. The system according to claim 1, further comprising an imaging sensor configured to capture the first image and the second image.

9. An imaging system comprising an dichroic beamsplitter having a dichroic optical coating configured to provide for a broad band spectrum of light emitted from a laser beam to pass through the dichroic beamsplitter independent of an angle of incidence of the dichroic beamsplitter and to at least one of transmit and reflect light emitted from the laser beam wherein transmission or reflection of the laser beam is determinative from the angle of incidence of the dichroic beamsplitter wherein the broad band spectrum of light comprises at least one of near infrared spectrum and short wave infrared spectrum, long wave infrared spectrum, and visible light spectrum.

10. The system according to claim 9, further comprising a mechanism configured to at least one of increase and decrease the angle of incidence of the dichroic beamsplitter.

11. The system according to claim 9, wherein the dichroic optical coating is configured to shift to a reduced wavelength capable of passing through the dichroic beamsplitter as the angle of incidence of the dichroic beamsplitter increases.

12. The system according to claim 9, wherein the dichroic optical coating is configured to shift to an increased wavelength, with a reduced angle of incidence, capable of passing through the dichroic beamsplitter as the angle of incidence of the dichroic beamsplitter increases.

13. The system according to claim 9, wherein to transmit the laser beam and to reflect the laser beam are provided with the angle of incidence of the dichroic beamsplitter of approximately ten degrees apart for transmission and reflection.

14. The system according to claim 9, wherein to reflect the laser beam is provided with the angle of incidence being approximately 45 degrees and to transmit the laser beam is provided with the angle of incidence being at least one of approximately 35 degrees and 55 degrees.

15. The system according to claim 9, further comprising a sensor configured to capture an image passing through the dichroic beamsplitter.

16. A method comprising:
tilting a dichroic beamsplitter located within an imaging system during a first mode to a first angle, by a tilt mechanism coupled to the dichroic beamsplitter;
transmitting a first image in a broad band spectrum through the dichroic beamsplitter, having a dichroic optical coating, during the first mode;
tilting the dichroic beamsplitter during a second mode to a second angle, by the tilt mechanism;
transmitting a second image in the broad band spectrum through the dichroic beamsplitter, having the dichroic optical coating, during the second mode;
reflecting a laser beam from the dichroic beamsplitter when the dichroic beamsplitter is at the first angle; and
transmitting the laser beam through the dichroic beamsplitter when the dichroic beamsplitter is at the second angle.

17. The method according to claim 16, wherein the broad band spectrum comprises at least one of near infrared spectrum and short wave infrared spectrum.

18. The method according to claim 16, further comprising capturing, by an imaging sensor, the first image or the second image.

19. The method according to claim 16, wherein reflecting the laser beam from the dichroic beamsplitter when the dichroic beamsplitter is at the first angle provides for laser designation and ranging.

20. The method according to claim 16, wherein transmitting the laser beam through the dichroic beamsplitter when the dichroic beamsplitter is at the second angle provides for laser spot tracking.

* * * * *